(12) United States Patent
Kim et al.

(10) Patent No.: US 6,653,176 B2
(45) Date of Patent: Nov. 25, 2003

(54) METHOD FOR MANUFACTURING X-RAY DETECTOR

(75) Inventors: Hyun Jin Kim, Kyoungki-do (KR); Seung Moo Rim, Kyoungki-do (KR); Jin Hui Cho, Kyoungki-do (KR); Kyoung Seok Son, Chungcheongnam-do (KR)

(73) Assignee: Boe-Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 10/316,406

(22) Filed: Dec. 11, 2002

(65) Prior Publication Data

US 2003/0119232 A1 Jun. 26, 2003

(30) Foreign Application Priority Data

Dec. 22, 2001 (KR) ........................................ 2001-83317

(51) Int. Cl.⁷ .................. H01L 21/00; H01L 21/44; H01L 21/4763; H01L 21/302
(52) U.S. Cl. .................. 438/149; 438/30; 438/40; 438/42; 438/161; 438/597; 438/640; 438/671; 438/717; 438/942
(58) Field of Search .............................. 438/30, 40, 42, 438/149, 161, 597, 640, 671, 717, 942

(56) References Cited

U.S. PATENT DOCUMENTS

| 5,254,480 A | 10/1993 | Tran |
|---|---|---|
| 5,315,101 A | 5/1994 | Hughes et al. |
| 5,525,527 A | 6/1996 | Tran |
| 6,242,746 B1 | 6/2001 | Teranuma et al. |
| 6,323,490 B1 | 11/2001 | Ikeda et al. |
| 6,340,812 B1 | 1/2002 | Izumi et al. |
| 6,340,818 B1 | 1/2002 | Izumi et al. |
| 6,528,819 B2 * | 3/2003 | Choo et al. .................. 257/59 |
| 6,531,346 B1 * | 3/2003 | Kim .......................... 438/149 |
| 2002/0145116 A1 * | 10/2002 | Choo et al. ............ 250/370.09 |

* cited by examiner

Primary Examiner—Nathan J. Flynn
Assistant Examiner—Stanetta Isaac
(74) Attorney, Agent, or Firm—Ladas & Parry

(57) ABSTRACT

A method for manufacturing an x-ray detector comprises the steps of: preparing an insulating substrate; forming a gate and a pad on the insulating substrate; forming a gate insulating film, an amorphous silicon layer and an etch stopper over the insulating substrate, inclusive of the gate and the pad; simultaneously forming a channel layer, an ohmic contact layer and a source/drain over the gate insulating film, inclusive of the etch stopper, and a common electrode over a proper portion of the gate insulating film; forming a first storage electrode over the gate insulating film, inclusive of the common electrode; forming a protective layer over the entire structure of the insulating substrate on which the source/drain and the first storage electrode have been formed, and subsequently forming a contact hole and via holes over a proper portion of the protective layer; and forming a second storage electrode over the protective layer. By this method, the conventional eight masking steps are reduced to six masking steps, and as a result, simplification of the manufacturing process of the x-ray detector is accomplished, thus resulting in reduction of production costs and enhancement of productivity is accomplished by minimizing the possibility of occurrence of inferior products.

10 Claims, 4 Drawing Sheets

METHOD FOR MANUFACTURING X-RAY DETECTOR

BACKGROUND OF THE INVENTION

1. Field of the invention

The present invention relates to a method for manufacturing an x-ray detector, and more particularly to a method for manufacturing an x-ray detector that can reduce the number of steps in a process for manufacturing it.

2. Description of the Prior Art

As generally known in the art, a film printing type x-ray photographing method is widely utilized for medical purposes. However, because printing can only be started after film is photographed, the results can only be recognized after a certain passage of time. Further, other problems exist such as safekeeping and preservation of the film after it is photographed.

As a result, conventionally, digital x-ray detectors (DXD) are studied and developed utilizing thin film transistor (TFT) arrays to overcome the above-noted problems. In this conventional x-ray detector, TFT is used as a detector.

However, the required conditions for a detector employing TFT are different from those required for an LCD employing TFT.

Specifically, the response speed is important for the conventional LCD TFT. However, signals should be transmitted as soon as x-ray detector TFT has been electrically charged, and signals are instantly transmitted to a picture after they receive x-ray signals for a comparatively long time. As a result, low off current ($I_{OFF}$) properties below 0.1 pA and low line resistance are required by necessity, so that leakage currents are not produced in the pixels of the TFT.

Furthermore, an etch stopper (E/S) TFT structure is more adaptable for low off current ($I_{OFF}$) properties than a back channel etch (BCE) TFT structure. Also, it is required to construct storage capacitance for a second storage electrode which is an electric charge collecting electrode (CCE) and is opposite to a first storage electrode.

As shown in FIG. 1, in the conventional x-ray detector that satisfies these requirements, gate insulating film 104a is formed on a substrate 100 upon which a gate 101, a gate pad 102 and a data pad 103 have been formed. Also, an etch stopper 108 is positioned over a channel layer 106 on the gate insulating film 104a, and an ohmic contact layer 110 and source/drain 114a, 114b are positioned over the etch stopper 108 to constitute a thin film transistor (TFT).

Additionally, a protective film 118 is formed over the thin film transistor (TFT), and a second storage electrode/ electrical charge collecting electrode 122 is positioned over the protective film 118. The second storage electrode 122 is opposite to a first storage electrode 112, and a common electrode 116 is formed on the first storage electrode 112. The second storage electrode 122 contacts a portion of the source/drain 114a, 114b by way of a contact hole 120.

This x-ray detector radiates x-rays from x-ray sources to a predetermined objects such as human body and forms corresponding images from the emitted signals in a TFT detector. In particular, as the detected signals of the TFT detector are digitalized, they are more favorable for long distance transmission.

However, there are certain problems, as explained below, in x-ray detectors in accordance with the above-noted conventional art.

It is required to form an etch stopper for the conventional x-ray detector having low off current properties, as noted above, and is required to form a second storage electrode/ electrical charge collecting electrode in order to form a storage capacitance.

As a result, several steps are required to manufacture an x-ray detector in accordance with the conventional art. That is, masking for forming a gate, masking for forming an etch stopper, masking for forming an active layer, masking for forming a first storage electrode, masking for forming contact holes, masking for forming source/drain, masking for forming a protective layer, and masking for forming a second storage electrode, etc., is required.

As stated above, because eight masking steps are required to manufacture the conventional x-ray detector, the process for manufacturing an x-ray detector is complicated, the possibility of producing inferior products is high, and manufacturing costs of the x-ray detector increase.

SUMMARY OF THE INVENTION

Accordingly, the present invention has been made to solve the above-mentioned problems occurring in the prior art, and an object of the present invention is to provide a method for manufacturing an x-ray detector, which can reduce the number of masking processes to result in the reduction of production costs, and enhance productivity by minimizing the possibility of occurrence of inferior products.

In order to accomplish this object, there is provided a method for manufacturing an x-ray detector, the method comprises the steps of: preparing an insulating substrate; forming a gate and a pad on the insulating substrate; forming a gate insulating film, an amorphous silicon layer and an etch stopper over the insulating substrate, inclusive of the gate and the pad; simultaneously forming a channel layer, an ohmic contact layer and a source/drain over the gate insulating film, inclusive of the etch stopper, and a common electrode over a proper portion of the gate insulating film; forming a first storage electrode over the gate insulating film, inclusive of the common electrode; forming a protective layer over the entire structure of the insulating substrate on which the source/drain and the first storage electrode have been formed, and subsequently forming a contact hole and via holes over a proper portion of the protective layer; and forming a second storage electrode over the protective layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
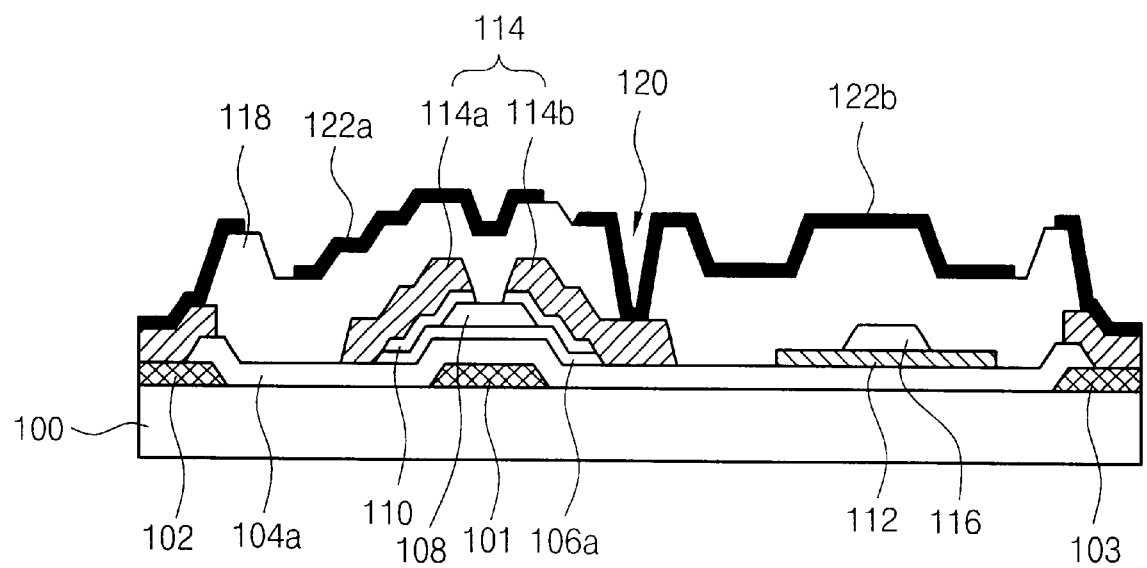
FIG. 1 is a cross sectional view depicting a conventional method for manufacturing an x-ray detector.
Figure 2A:
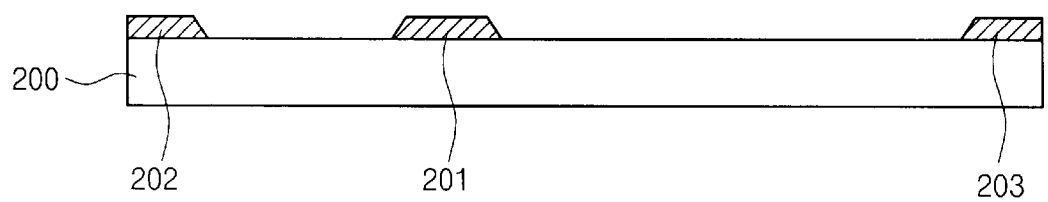
FIGS. 2a to 2f are cross sectional views depicting the steps in the method for manufacturing an x-ray detector in accordance with the present invention.

According to the method for manufacturing an x-ray detector in accordance with the present invention, as shown in FIG. 2a, a transparent insulating substrate 200 such as glass is prepared firstly, and a gate 201, a gate pad 202 and a data pad 203 are formed over the insulating substrate 200.

Figure 2B:
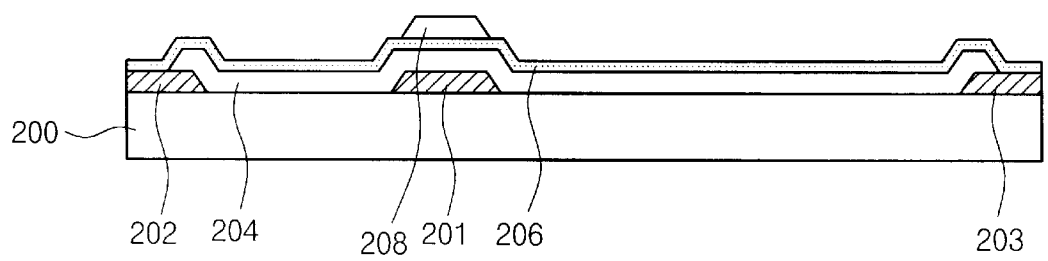

Subsequently, as shown in FIG. 2b, gate insulating film 204 is deposited over the insulating substrate 200 including the gate 201, the gate pad 202 and the data pad 203, and then an amorphous silicon layer 206 is deposited over the gate insulating film 204. Next, an etch stopper 208 is formed over the amorphous silicon layer 206, which is for preventing a channel layer 206a from being impaired when the source/drain 214a, 214b are formed, as will be explained below. The amorphous silicon layer 204 is a thin film that will be patterned to be the channel layer in the following process.

Figure 2C:
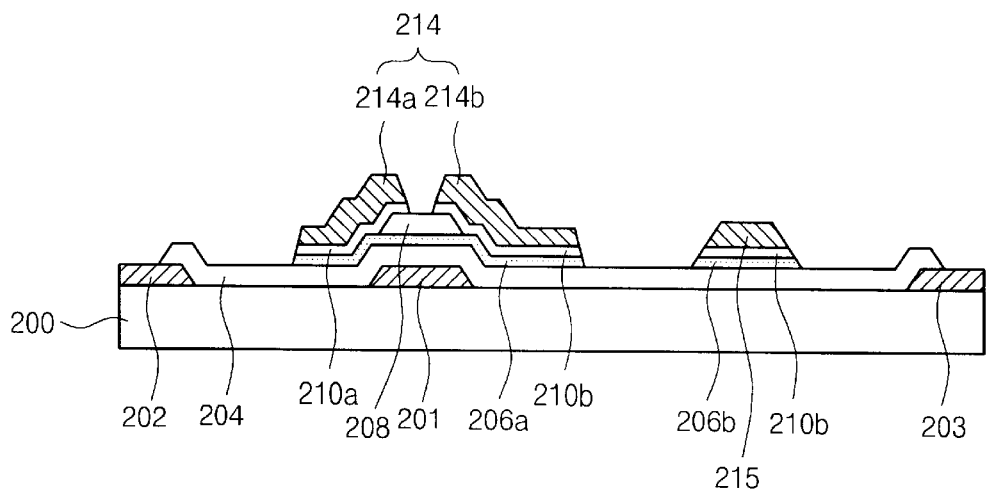

Referring now to FIG. 2c, an amorphous silicon layer doped with impurities and a metal layer with good electrical conductivity are continuously deposited over the amorphous silicon layer 206 including the etch stopper 208. Then, the metal layer and the amorphous silicon layer doped with impurities are patterned by way of masking process. As a result, an ohmic contact layer 210 composed of the amorphous silicon layer doped with impurities and a source/drain 214a, 214b formed from the metal layer are produced over the gate insulating film 204.

Meanwhile, a common electrode 214c made of the same material as that of the source/drain 214a, 214b is formed over the amorphous silicon layer 206, 210, patterned on a desired portion of the gate insulating film 204, simultaneously with the patterning of the source/drain 214a, 214b, the ohmic contact layer 210a, and the channel layer 206a.

Figure 2D:
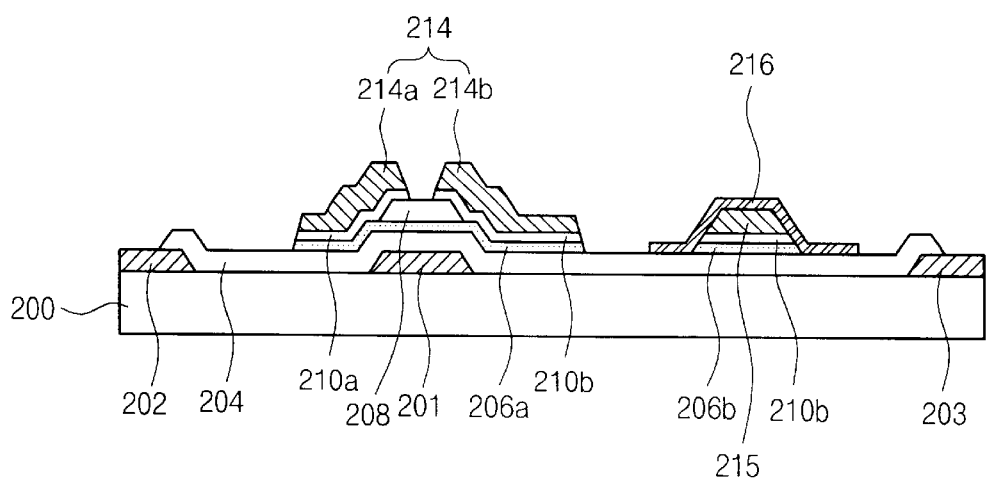

Referring to FIG. 2d, a first storage electrode 216 is formed over the gate insulating film 204 and the common electrode 215. Common signals from the common electrode 215 are applied to the first storage electrode 216, and the first storage electrode 216 constitutes a storage capacitance together with a second storage electrode 224, as will be described below.

Figure 2E:
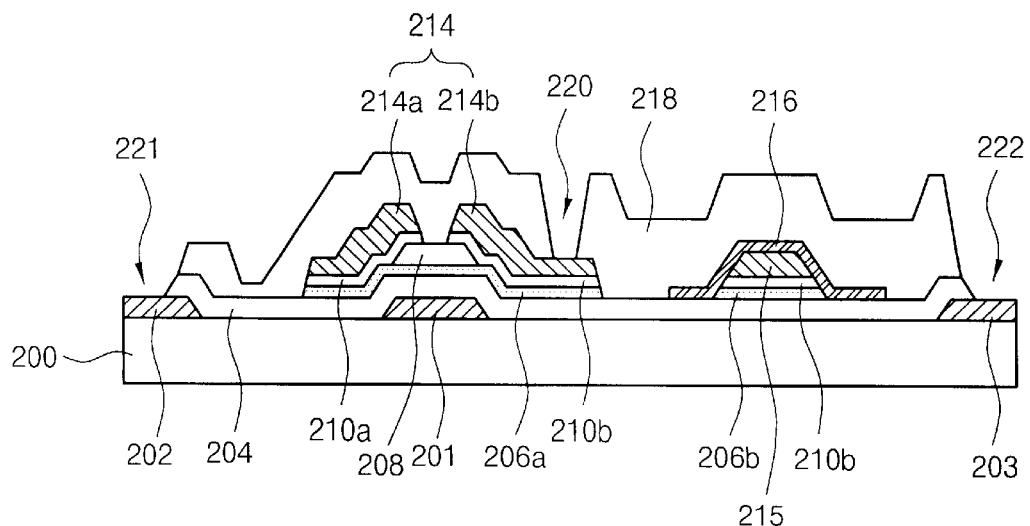

Then, as shown in FIG. 2e, a protective film 218 is formed all over the whole structure of the insulating substrate 200, on which the source/drain 214a, 214b, and the first storage electrode 216 are formed. In succession, a contact hole 220 is formed by selectively removing the protective layer 218 so that a portion of the source/drain 214a, 214b is exposed. Meanwhile, via holes 221, 222 which expose surfaces of the gate pad 202 and the data pad 204 are formed simultaneously with the contact hole 220, using the same mask.

Figure 2F:
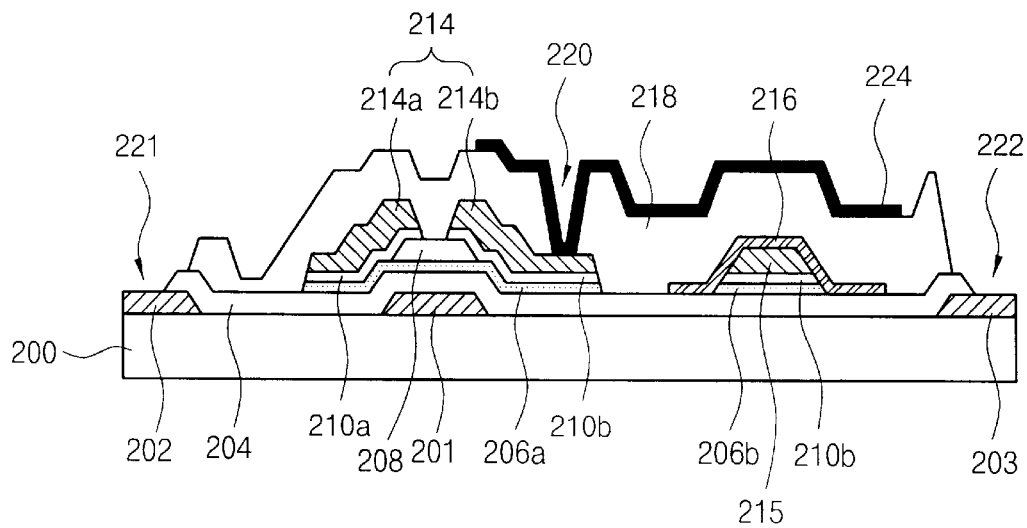

Further, as shown in FIG. 2f, a second storage electrode 224 is formed over the protective film 218, wherein the second storage electrode 224 is opposite to the first storage electrode 216 and contacts a portion of the source/drain 214a, 214b via the contact hole 220.

According to the present invention, the second storage electrode 224 functions as an electrical charge collecting electrode, and as stated above, constitutes storage capacitance in cooperation with the first storage electrode 216. The second storage electrode 224 also functions as a path through which stored electrical charges are drained to an outer circuit (not shown) from the source/drain 214a, 214b.

In the processes that follow, the method for manufacturing an x-ray detector in accordance with the present invention, although not shown in the drawings, a photo-transforming portion is formed by applying a photo sensing material such as selenium (Se) over the detector, and a transparent conductive electrode is formed over the photo transforming portion so that x-ray radiation can penetrate it. Then, the x-ray detector of the present invention is manufactured by proceeding with the predetermined following process.

The following effects are obtained in accordance with the method for manufacturing the x-ray detector of the present invention as described above.

The conventional eight masking steps required to manufacture the conventional x-ray detector are reduced to six masking steps in accordance with the present invention. As a result, simplification of the manufacturing process of the x-ray detector is accomplished, also resulting in reduction of production costs. Also, productivity can be increased by minimizing the possibility of occurrence of inferior products.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing an x-ray detector having an insulating substrate, the method consisting the six sequential steps of:

forming a gate and a pad on the insulating substrate;

forming a gate insulating film over a selected area of the insulating substrate having the gate and the pad, forming an amorphous silicon layer over the insulating substrate and forming an etch stopper over the amorphous silicon layer forming a channel layer, an ohmic contact layer and a source/drain over the gate insulating film which includes the etch stopper, and forming a common electrode over a proper portion of the gate insulating film simultaneously;

forming a first storage electrode over the gate insulating film which includes the common electrode;

before forming a second storage electrode, forming a protective layer over the entire structure of the insulating substrate on which the source/drain and the first storage electrode have been formed, and subsequently forming a contact hole and via holes over a proper portion of the protective layer; and forming the second storage electrode over the protective layer.

2. A method for manufacturing an x-ray detector, the method comprising the steps of:

preparing an insulating substrate;

forming a gate and a pad on the insulating substrate;

forming a gate insulating film, an amorphous silicon layer and an etch stopper over the insulating substrate, inclusive of the gate and the pad;

forming a channel layer, an ohmic contact layer and a source/drain over the gate insulating film which includes the etch stopper, and forming a common electrode over a proper portion of the gate insulating film simultaneously, wherein the channel layer, ohmic contact layer, and source/drain are formed simultaneously, using the same mask;

forming a first storage electrode over the gate insulating film which includes the common electrode;

forming a protective layer over the entire structure of the insulating substrate on which the source/drain and the first storage electrode have been formed, and subsequently forming a contact hole and via holes over a proper portion of the protective layer; and forming a second storage electrode over the protective layer.

3. The method of claim 2, wherein the step of forming the contact hole and the via holes comprises:

a first substep of forming the contact hole by removing the protective layer selectively so that a portion of the source/drain is exposed; and a second substep of forming a plurality of via holes simultaneously by removing the protective layer selectively so that a portion of the pad is exposed.

4. The method of claim 3, wherein the contact hole and the via holes are formed simultaneously by using the same mask.

5. The method of claim 2, wherein the second storage electrode contacts a portion of the source/drain via the contact hole and is opposite to the first storage electrode.

6. The method of claim 2, wherein the insulating substrate is made of a transparent body.

7. The method of claim 2, wherein the first storage electrode and the second storage electrode together constitute one storage capacitance.

8. The method of claim 2, wherein the second storage electrode functions as a electrical charge collecting electrode.

9. The method of claim 2, wherein the second storage electrode functions as a path through which stored electrical charges are drained to an outer circuit from the source/drain.

10. The method of claim 2, wherein the common electrode is formed from the same material as that of the source/drain.

* * * * *